United States Patent [19]

Yonemoto et al.

[11] Patent Number: 5,208,464
[45] Date of Patent: May 4, 1993

[54] DEVICE FOR DETECTING ERRORS IN TOP/BOTTOM/FRONT/BACK ORIENTATION OF A LEAD FRAME

[75] Inventors: Michio Yonemoto; Masayuki Shimura, both of Tokyo, Japan

[73] Assignee: Kabushiki Kaisha Shinkawa, Tokyo, Japan

[21] Appl. No.: 801,444

[22] Filed: Dec. 2, 1991

[30] Foreign Application Priority Data

Nov. 30, 1990 [JP] Japan ................................. 2-336611

[51] Int. Cl.⁵ ............................................. G01N 21/86
[52] U.S. Cl. .................................... 250/561; 356/398
[58] Field of Search ........................... 250/223 R, 561; 356/393, 398; 901/47

[56] References Cited

U.S. PATENT DOCUMENTS 4,736,108 4/1988 Comstock et al. .................. 250/561
4,929,845 5/1990 Amir et al. ............................ 250/561

FOREIGN PATENT DOCUMENTS 57-29310 6/1982 Japan .

Primary Examiner—David C. Nelms
Assistant Examiner—K. Shami
Attorney, Agent, or Firm—Koda and Androlia

[57] ABSTRACT

A lead frame transporting device, which uses a pusher to feed a lead frame from a loader onto feeder rails and two optical sensors that are positioned above the both sides of the lead frame. The pusher feeds the lead frame a predetermined distance so that a first detecting point of the lead frame arrives under the sensors and then further feeds the lead frame so that a second detecting point of the lead frame arrives under the sensors. The sensors detects detecting holes of the lead frame at the first and second detecting points so that top or bottom and front or back of the lead frame is detected, so that improperly oriented lead frame is prevented from further being fed to a next step.

1 Claim, 4 Drawing Sheets

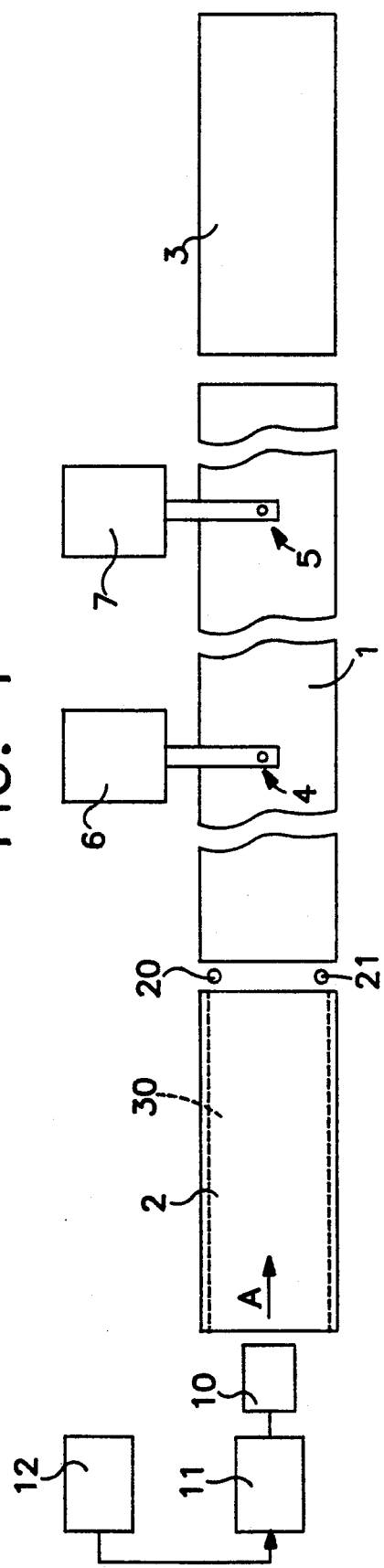
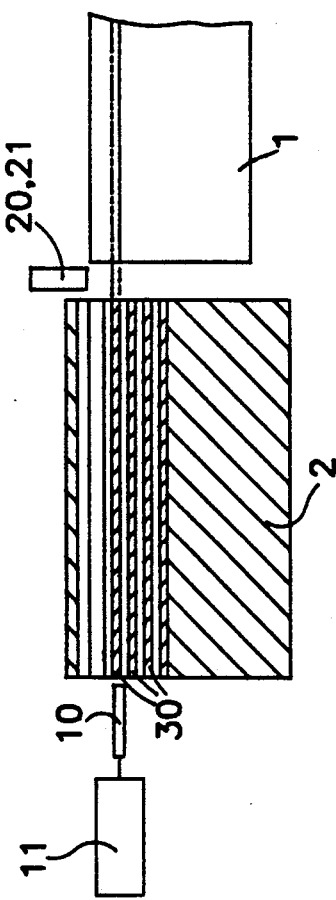
FIG. 1
FIG. 2

DEVICE FOR DETECTING ERRORS IN TOP/BOTTOM/FRONT/BACK ORIENTATION OF A LEAD FRAME

BACKGROUND OF THE INVENTION

1. Field of the Invention

This invention relates to a lead frame transporting device and more particularly to a device that detects top/bottom/front/back orientations of a lead frame that is fed into a die bonder, wire bonder, etc., thus preventing bonding errors.

2. Prior Art

Generally, in die bonding, lead frames stored in a lead frame loader are pushed out of the loader one at a time by a pusher onto feeder rails. On the feeder rails, a lead frame is pitch-fed to a preform station and then to a bonding station.

More specifically, on the preform station, adhesive is drip-applied to the lead frame by preform assembly, then on the following bonding station a bonding head performs the die bonding to the lead frame. The position of the lead frame on the preform and bonding stations is set by inserting positioning pins in holes that are opened near both side edges of the lead frames.

However, the operator sometimes makes a mistake when storing the lead frames in the loader. For instance, the direction or orientation of the lead frames are not consistent in the loader. In prior art devices, detection of improper top/bottom/front/back orientation of a lead frame that is derived from the erroneous storing of the lead frames in the loader is performed by detecting whether or not a positioning pin provided at the preform station is entered a specific lead frame hole. An example of this type of device is disclosed in the Japanese Utility Model Application Publication (Kokoku) No. 57-29310.

In this prior art, however, errors in top/bottom/front/back orientation of the lead frame are not able to be detected until the lead frame is fed to the preform station. This is a problem, because for the lead frame that is improperly oriented on the preform station, correction of such an improper orientation cannot be easily done. Also, if the positioning holes of the lead frame are positioned symmetrically with respect to the direction in which the lead frame is transferred, the pin would enter the positioning holes even if the lead frame orientation is reversed, resulting in the improper orientation of the lead frame not being detected.

SUMMARY OF THE INVENTION

The object of the present invention is to provide a lead frame transporting device that not only detects the top/bottom/front/back orientation of a lead frame before it reaches the preform station, but also can do it regardless of the location of the lead frame positioning holes.

The object of the present invention is accomplished by a unique structure that uses two optical sensors disposed between the loader and feeder rail. The sensors are positioned so that they are above the side edges of the lead frame, thus creating a detecting location underneath. A pusher pushes the lead frame so that a first detecting point of the lead frame is to a detecting location, and then the pusher further pushes the lead frame so that a second detecting point arrives at the detecting location. At the detecting location, the sensors detect the first and second detecting points of the lead frame; as a result, asymmetrical features of the lead frame are checked to detect errors in top/bottom/front/back orientation.

The first pushing operation of the pusher feeds the first detecting point of the lead frame directly under the two sensors, so that the sensors detect the first detecting point of the lead frame. Then, the second detecting point of the lead frame is fed directly under the two sensors by the second pushing operation of the pusher, where the second detecting point is detected by the two sensors. The first and second detecting points are respectively detected by the two sensors.

Based upon logic derived from the sensor detection signals generated by the detection performed by the sensors at the first and second detecting points, the top/bottom/front/back orientation of the lead frame is determined.

BRIEF DESCRIPTION OF THE DRAWINGS

FIG. 1 is a simplified top view showing one embodiment of the present invention;

FIG. 2 is a simplified front view of the area around the loader used in the embodiment of FIG. 1;

FIG. 3 shows the essential portions of the embodiment of the invention wherein

DETAILED DESCRIPTION OF THE INVENTION

Figure 3A:
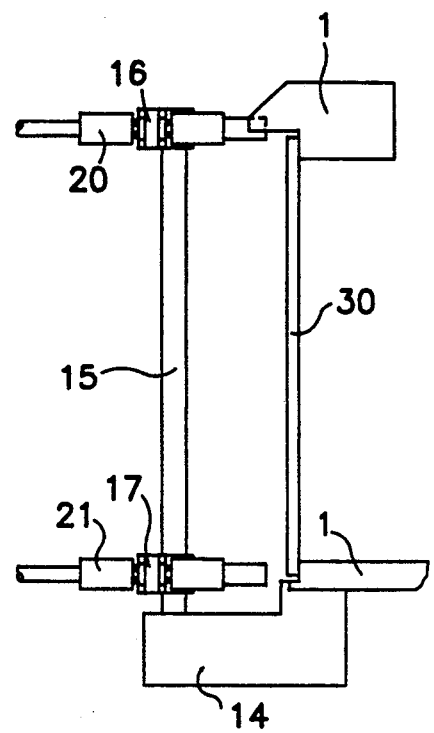
FIG. 3(a) is a top view thereof.

In FIG. 1, provided at the left side of feeder rails 1, which transport lead frames 30 by a means that is not shown in the drawings, is a loader 2. Lead frames 30 are stored in this loader 2. Provided at the right side of the feeder rails 1 is an unloader 3 which receives the lead frames 30.

On feeder rails 1, preform station 4 and bonding station 5 are provided along the direction A in which the lead frames are transferred. The preform station 4 is positioned upper stream side relative to the bonding station 5. At the preform station 4 and bonding station 5, a positioning pin (not shown) is inserted into hole 31 (see FIG. 4) to position the lead frame 30. The hole 31 is one of the positioning hole set that consists of holes 30, 31 and 32 and is provided in the lead frame 30.

At preform station 4, adhesive is drip-applied to the lead frame 30 by a preform unit 6, the structure of which is well known. Also, at bonding station 5, die bonding is performed to the lead frame 30 by a bonding head 7, the structure of which is also well known.

Provided next to the loader 2 is a pusher 10 that pushes one lead frame onto the feeder rail 1. Pusher 10 is driven by pusher drive unit 11, which provides a forward drive in accordance with a drive length that is set by commands supplied from a pusher drive length controller ("pusher controller") 12. The pusher controller 12 is arranged such that a lead frame 30 is fed so that at least two detecting points 34 and 35 of the lead frame 30 are brought under the two sensors 20 and 21.

Two sensors 20 and 21 are provided above the feed path of the lead frames 30 between the loader 2 and feeder rail 1, thus creating a detecting location underneath.

Figure 3C:
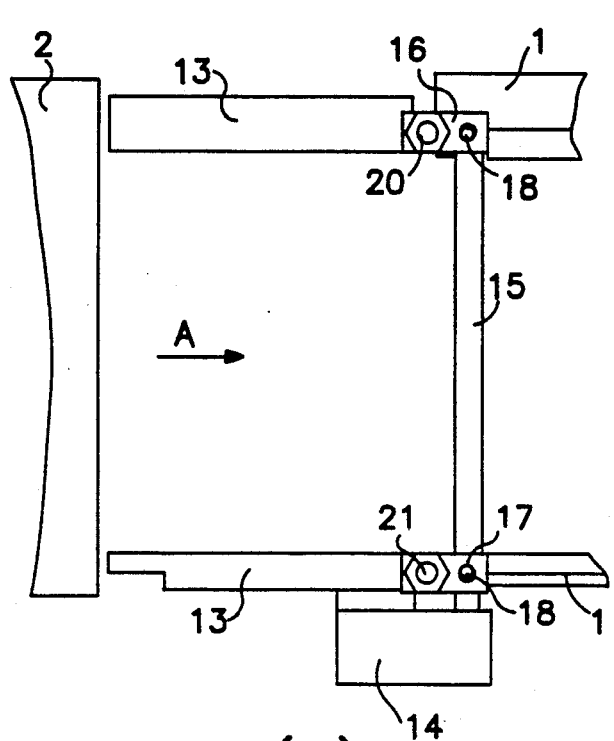
FIG. 3(c) is a right side view.
Figure 3B:
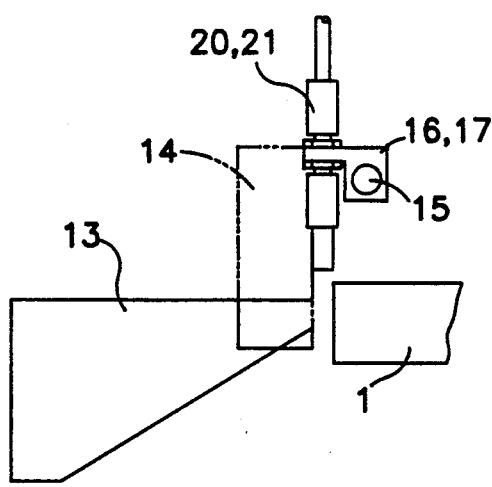
FIG. 3(b) is a front view.

FIGS. 3(a), 3(b) and 3(c) show the essential details of the invention.

Guide rails 13 are installed between loader 2 and feeder rails 1. The guide rails 13 guide the lead frames 30 supplied to it from loader 2 onto the feeder rails 1. Thus, if the ends of the feeder rails 1 are set in the vicinity of loader 2, there is no particular requirement to have the guide rails 13 between the loader 2 and the feeder rails 1.

Support plate 14 is attached to the side of guide rail 13, and sensor support rod 15 is attached to the support plate 14. Sensor support rod 15 is mounted at the sides of guide rails 13 and above the feeder rails 1. The support rod 15 is perpendicular to the direction A in which the lead frame travels.

Sensor support brackets 16 and 17, which contain the sensors 20 and 21, respectively, are mounted on sensor support rod 15 such that they are free to slide. Sensor support brackets 16 and 17 are secured to sensor support rod 15 by screws 18. Therefore, even in the case in which different types of lead frames are to be transferred, positions of the sensors 20 and 21 can easily be adjusted to the detection points of the new lead frames by loosening screws 18 and sliding the sensor plates 16 and 17 along the sensor support rod 15.

The operation of the lead frame transfer by the thus structured device will be explained below with reference to FIG. 4.

Figure 4A:
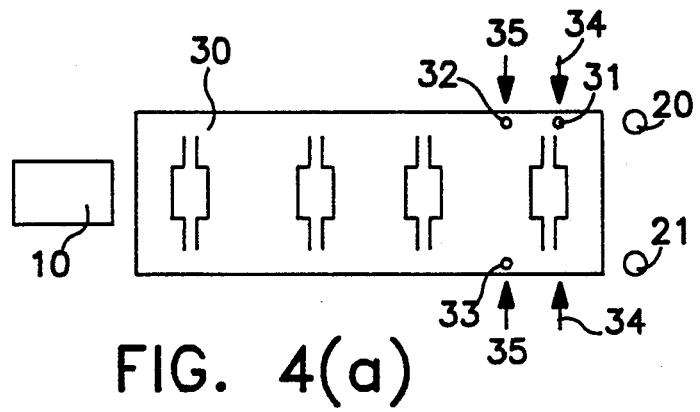
FIGS. 4(a), 4(b) and 4(c) show operation steps of the lead frame in the present invention.
Figure 4B:
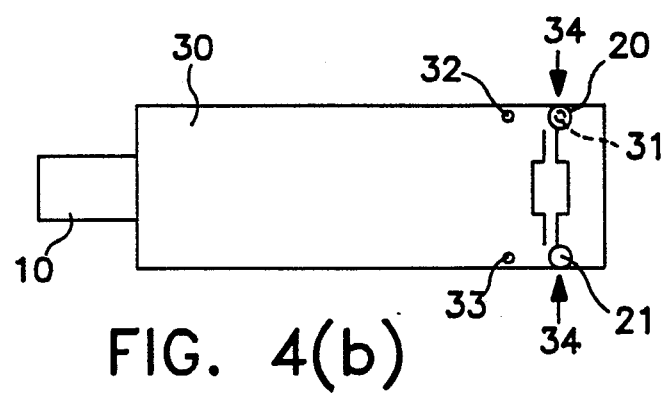
Figure 4C:
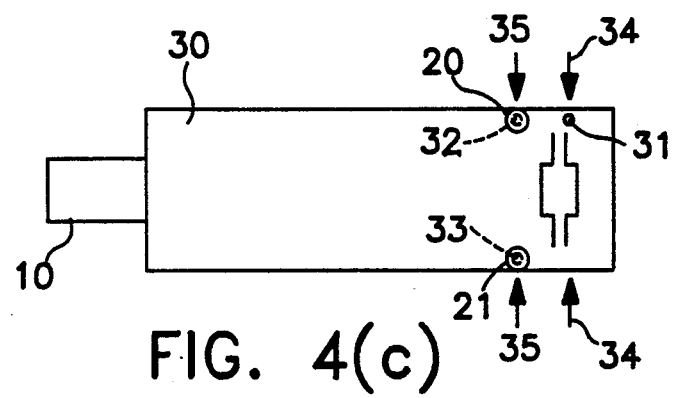

One lead frame 30 that has been stored in loader 2 is pushed forward by the first feed operation of the pusher 10. As shown in FIG. 4(a), the lead frame 30 is fed the length which is set by the commands from pusher controller 12 so that the first detecting point 34 of the lead frame 30 comes directly under the sensors 20 and 21. As shown in FIG. 4(b), sensors 20 and 21 detect the presence or absence of the hole 31 of the lead frame 30. Thereafter, the lead frame 30 is pushed forward by the second feed operation of the pusher 10. This time, the lead frame is fed the length which is set by commands from pusher controller 12 so that the second detecting point 35 of the lead frame 30 reaches directly under the sensors 20 and 21. Then, as shown in FIG. 4(c), the sensors 20 and 21 detect the presence or absence of the holes 32 and 33.

Detection signals result from the detecting actions by the sensors 20 and 21 and by the two-step pushing movements of the lead frame by the pusher. Based upon the detection signals, an ON-OFF logic in relation to the asymmetrical features of lead frame 30 is created by a logic circuit (not shown), and a judgment is made as to the top/bottom/front/back orientation of the lead frame 30.

FIG. 5 explains this logic. FIG. 5(a) shows a lead frame 30 being fed in a proper ("correct") posture, showing the top side with front end 30a forward; FIG. 5(b) shows the lead frame flipped over in the left-to-right direction from FIG. 5(a) posture ("upside-down backwards"), showing the bottom side with front end 30a backward; FIG. 5(c) shows the lead frame flipped over in the top-to-bottom direction from FIG. 5(a) posture ("upside down"), showing the bottom side with the front end 30a forward; and FIG. 5(d) shows the lead frame turned in the right-to-left direction from FIG. 5(a) posture ("backwards"), showing the top side with the front end 30a backward.

Table 1 shows the ON and OFF of sensors 20 and 21 at the first detecting point 34 and second detecting point 35 of the lead frame 30 in each of the above orientations.

TABLE 1

| Detecting Points | 34 | | 35 | |
|---|---|---|---|---|
| Sensors | 20 | 21 | 20 | 21 |
| "Correct" | ON | OFF | ON | ON |
| "Upside Down Backward" | ON | OFF | ON | OFF |
| "Upside Down" | OFF | ON | ON | ON |
| "Backward" | OFF | ON | OFF | ON |

Figure 5A:
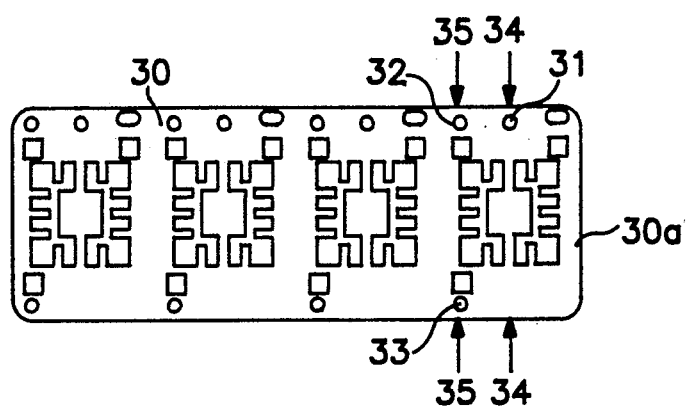
FIGS. 5(a) through 5(d) show top/bottom/front/back positions of the lead frame.
Figure 5B:
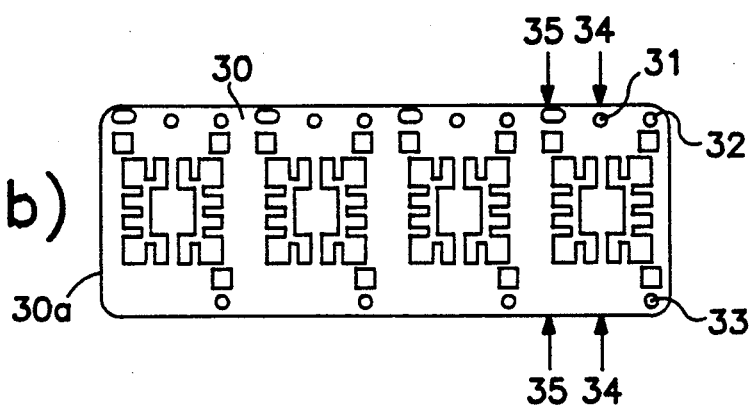
Figure 5C:
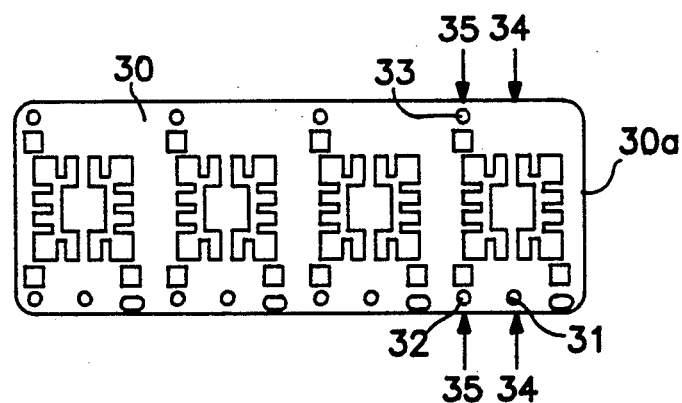
Figure 5D:
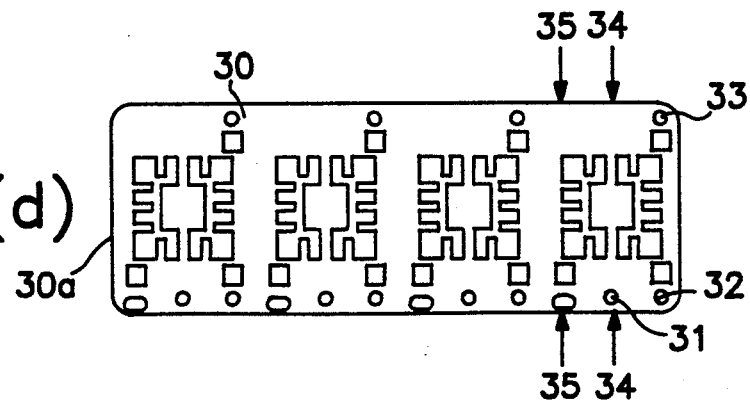

More specifically, at the first detecting point 34, if sensor 20 is ON and sensor 21 is OFF, the lead frame position is either "correct" or "upside down backward" as shown in FIG. 5(a) or 5(b), respectively. If sensor 20 is OFF and sensor 21 ON, the lead frame position is either "upside down," or "backward," as shown in FIG. 5(c) or 5(d), respectively. Accordingly, at the first detecting point 34, if sensor 20 is OFF and sensor 21 ON, a "defect signal" is outputted and the lead frame transfer is stopped (and orientation correction is made), thus preventing erroneous bonding.

With the lead frame at the first detecting point 34, if sensor 20 is ON and sensor 21 is OFF ("correct" or "upside down backward"), lead frame 30 is sent on so that the second detecting point 35 arrives at the detecting location by the second pushing operation of the pusher 10. Then, if sensor 21 is still OFF, it means that the lead frame is oriented "upside down backward" as in FIG. 5(b). Thus, a "defect signal" is outputted, and the feeding operation is stopped, thus preventing erroneous bonding.

As seen from the above, by checking the asymmetrical features of the lead frame 30, logic can be derived to make judgments as to the top/bottom/front/back orientation of the lead frame. Also, when detecting different types of lead frames, sensors 20 and 21 can be moved in the width direction of the lead frame, and adjustments in the feed distance of lead frame 30 is easily done by changing the length of the feed by the pusher that is set by the pusher controller 12.

As a result, according to the present invention, judgments as to the orientation or direction of the lead frame that is being transported can be made without error. Moreover, since this judgment is made in the early stage of the lead frame's entrance into the feeding line, the associated work can be done extremely efficiently.

We claim:

1. A lead frame transporting device comprising, a pusher for feeding out a lead frame from a loader; feeder rails which carries said lead frame to a detecting location; two optical sensors provided between said loader and feeder rail such that said sensors are positioned on both sides of a lead frame, said optical sensors detecting a first detecting point of said lead frame which is carried by said pusher to said detecting location and then detecting a second detecting point of said lead frame which is further carried by said pusher to said detecting location, thus detecting if said lead frame in its top/bottom/front/back orientation is in error.

* * * * *